(12) United States Patent
Jeong et al.

(10) Patent No.: US 10,096,716 B2
(45) Date of Patent: Oct. 9, 2018

(54) THIN FILM TRANSISTOR ARRAY PANEL AND METHOD OF MANUFACTURING THE SAME

(71) Applicant: Samsung Display Co., Ltd., Yongin-si (KR)

(72) Inventors: Yu-Gwang Jeong, Anyang-si (KR); Hyun Min Cho, Asan-si (KR); Su Bin Bae, Gyeongsan-si (KR); Shin Il Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 25 days.

(21) Appl. No.: 15/271,504

(22) Filed: Sep. 21, 2016

(65) Prior Publication Data

US 2017/0278977 A1    Sep. 28, 2017

(30) Foreign Application Priority Data

Mar. 24, 2016 (KR) .......................... 10-2016-0035386

(51) Int. Cl.
*H01L 29/10* (2006.01)
*H01L 29/12* (2006.01)
*H01L 29/786* (2006.01)
*H01L 27/12* (2006.01)

(52) U.S. Cl.
CPC ...... *H01L 29/78606* (2013.01); *H01L 27/124* (2013.01); *H01L 27/1225* (2013.01); *H01L 27/1288* (2013.01); *H01L 29/7869* (2013.01); *H01L 29/78633* (2013.01); *H01L 29/78696* (2013.01)

(58) Field of Classification Search
USPC ..... 257/72, 59, E51.018, E21.414, E29.147, 257/E29.151, E51.005, E21.632, 223, 257/227, 291, 292, 439, 655, E27.1, 257/E27.125, E27.112, E29.117, E29.145, 257/E29.182, E29.202, E29.273–E29.299, 257/E29.314, E29.32, E23.016; 438/22–47, 69, 48, 149, 493, 503, 507, 438/956
See application file for complete search history.

(56) References Cited

U.S. PATENT DOCUMENTS

| 6,262,436 | B1  | 7/2001  | Nakata |
| 7,995,157 | B2* | 8/2011  | Song ................. G02F 1/136286 349/139 |
| 2010/0320391 | A1* | 12/2010 | Antonuk ............. H01L 27/1462 250/366 |
| 2013/0256652 | A1  | 10/2013 | Lee et al. |

(Continued)

FOREIGN PATENT DOCUMENTS

| JP | H11-145478 | 5/1999 |
| KR | 10-2013-0058511 | 6/2013 |

(Continued)

*Primary Examiner* — Tram H Nguyen
(74) *Attorney, Agent, or Firm* — H.C. Park & Associates, PLC

(57) ABSTRACT

A thin film transistor array panel includes a substrate; a data line disposed on the substrate; a buffer layer disposed on the substrate and spaced apart from the data line in a plan view; a thin film transistor disposed on the buffer layer, the thin film transistor including an oxide semiconductor layer; and a pixel electrode connected to the thin film transistor.

26 Claims, 19 Drawing Sheets

(56) References Cited

U.S. PATENT DOCUMENTS

| | | |
|---|---|---|
| 2014/0175429 A1 | 6/2014 | Kim et al. |
| 2015/0108481 A1 | 4/2015 | Khang et al. |
| 2015/0162363 A1 | 6/2015 | Kim et al. |
| 2015/0357356 A1* | 12/2015 | Kim .................... H01L 27/1288 257/43 |

FOREIGN PATENT DOCUMENTS

| | | |
|---|---|---|
| KR | 10-2013-0111872 | 10/2013 |
| KR | 10-2014-0081413 | 7/2014 |
| KR | 10-2015-0045111 | 4/2015 |
| KR | 10-2015-0065246 | 6/2015 |

* cited by examiner

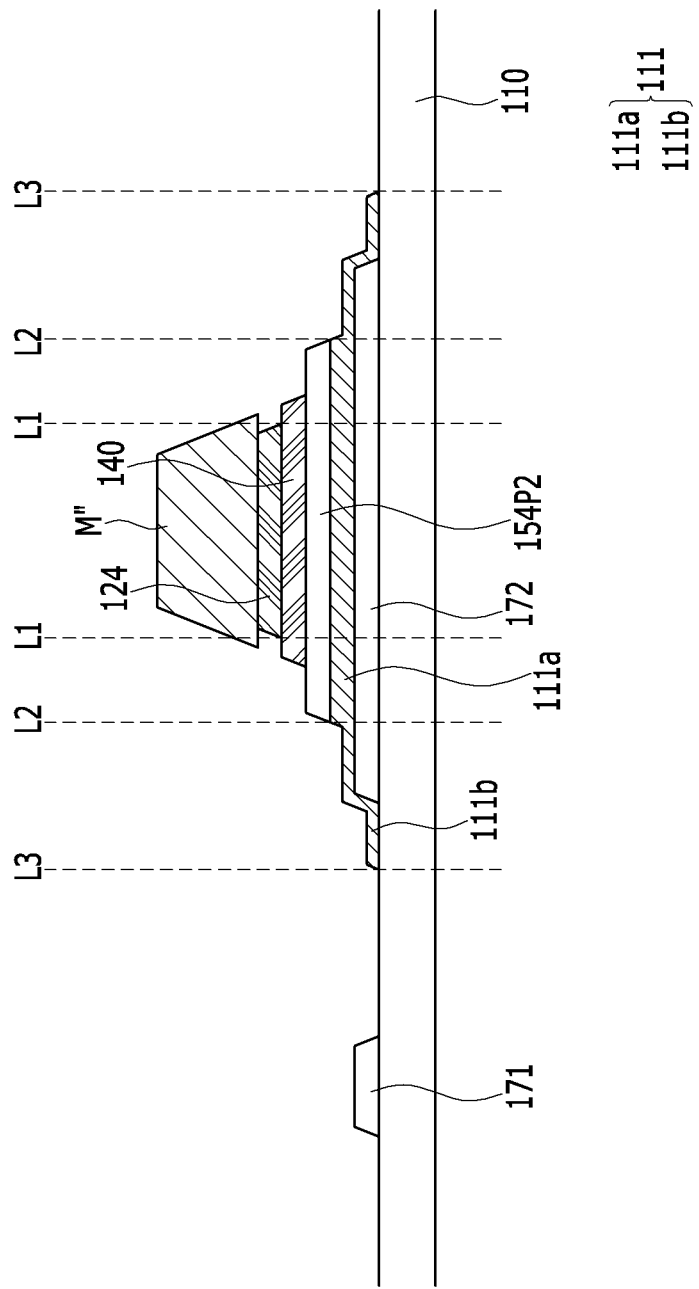

THIN FILM TRANSISTOR ARRAY PANEL AND METHOD OF MANUFACTURING THE SAME

CROSS-REFERENCE TO RELATED APPLICATION

This application claims priority from and the benefit of Korean Patent Application No. 10-2016-0035386, filed on Mar. 24, 2016, which is hereby incorporated by reference for all purposes as if fully set forth herein.

BACKGROUND

Field

The present disclosure relates to a thin film transistor array panel and a method of manufacturing the same.

Discussion of the Background

A thin film transistor (TFT) is used in various kinds of electronic devices, such as, for example, a display device. Thin film transistors may be used as switching element or driving elements in a liquid crystal display (LCD), an organic light emitting diode (OLED) display, and the like. Typically, a thin film transistor includes a gate electrode, a source electrode, a drain electrode facing the source electrode, and a semiconductor electrically connected to the source electrode and the drain electrode. Characteristics of the semiconductor generally determine characteristics of the thin film transistor.

Silicon (Si) is typically used as an element for the semiconductor. Silicon may be classified into amorphous silicon and polysilicon according to its crystal form. Amorphous silicon provides relatively low charge mobility and allows for a relatively simple manufacturing process, but issues may develop with respect to utilizing amorphous silicon in manufacturing high-performance thin film transistors. A stage is typically used to crystalize silicon to form polysilicon, which provides relatively high charge mobility, but its manufacturing costs are relatively higher and the manufacturing process is relatively more complicated. To complement the utilization of amorphous silicon and polysilicon in thin film transistors, effort has been directed to developing thin film transistors using an oxide semiconductor with relatively higher carrier mobility and a greater ON/OFF ratio than amorphous silicon, and relatively lower cost and higher uniformity polycrystalline silicon.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a thin film transistor array panel configured to prevent (or at least reduce) deterioration of mechanical and viewing characteristics.

One or more exemplary embodiments provide a method for manufacturing a thin film transistor with a simplified manufacturing process.

Additional aspects will be set forth in the detailed description which follows, and, in part, will be apparent from the disclosure, or may be learned by practice of the inventive concept.

According to one or more exemplary embodiments, a thin film transistor array panel includes a substrate; a data line disposed on the substrate; a buffer layer disposed on the substrate and spaced apart from the data line in a plan view; a thin film transistor disposed on the buffer layer, the thin film transistor including an oxide semiconductor layer; and a pixel electrode connected to the thin film transistor.

According to one or more exemplary embodiments, a method for manufacturing a thin film transistor array panel includes: forming a data line on a substrate; forming a buffer material layer on the substrate and the data line; forming a first oxide semiconductor pattern on the buffer material layer; forming a gate insulating pattern and a gate electrode on the first oxide semiconductor pattern; and forming a buffer layer by etching a portion of the buffer material layer that is, in a plan view, spaced apart from the gate insulating pattern and the gate electrode.

According to one or more exemplary embodiments, thin film transistor array panel includes a substrate, a data line, a buffer layer, a thin film transistor, and a pixel electrode. The data line is disposed on a first area of the substrate. The buffer layer is disposed on a second area of the substrate, the second area being spaced apart from the first area. The thin film transistor is disposed on the buffer layer. The thin film transistor includes an oxide semiconductor layer. The pixel electrode is connected to the thin film transistor. The buffer layer includes a first region and a second region. The first region overlaps the oxide semiconductor layer. The second region extends from the first region and is less thick than the first region.

According to one or more exemplary embodiments, a method for manufacturing a thin film transistor array panel includes: forming a data line on a substrate; forming a buffer material layer on the substrate and the data line; forming a first oxide semiconductor pattern on the buffer material layer; forming a gate insulating pattern and a gate electrode on the first oxide semiconductor pattern; forming a second oxide semiconductor pattern from the first oxide semiconductor pattern, formation of the second oxide semiconductor pattern forming a buffer material layer pattern from the buffer material layer; and forming a buffer layer from the buffer material layer pattern. The buffer layer includes a first portion and a second portion. The first portion overlaps the second oxide semiconductor pattern. The second portion extends from the first portion and is less thick than the first portion.

According to one or more exemplary embodiments, thin film transistor array panel includes a substrate, a data line, a buffer layer, a thin film transistor, a pixel electrode, and a light blocking layer. The data line is disposed on the substrate. The buffer layer is disposed on the substrate and does not overlap the data line. The thin film transistor is disposed on the buffer layer. The thin film transistor includes an oxide semiconductor layer. The pixel electrode is connected to the thin film transistor. The light blocking layer is disposed on a same layer as the data line. The light blocking layer overlaps the thin film transistor. The buffer layer overlaps the light blocking layer. The buffer layer includes a first region and a second region. Thicknesses of the first and second regions are different. The second region overlaps an edge of the light blocking layer.

According to one or more exemplary embodiments, characteristics of a thin film transistor may be improved that also improve reliability of a device utilizing the thin film transistor. To this end, a display device utilizing the thin film transistor may have an improved aperture ratio and charging ratio. According to one or more exemplary embodiments, a simplified manufacturing process may be achieved and damage to the thin film transistor that may otherwise occur during the manufacturing process may be prevented (or at least reduced).

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 18 and 19 are cross-sectional views of a thin film transistor array panel at various stages of manufacture, according to one or more exemplary embodiments.

DETAILED DESCRIPTION OF THE ILLUSTRATED EMBODIMENTS

Figure 1:
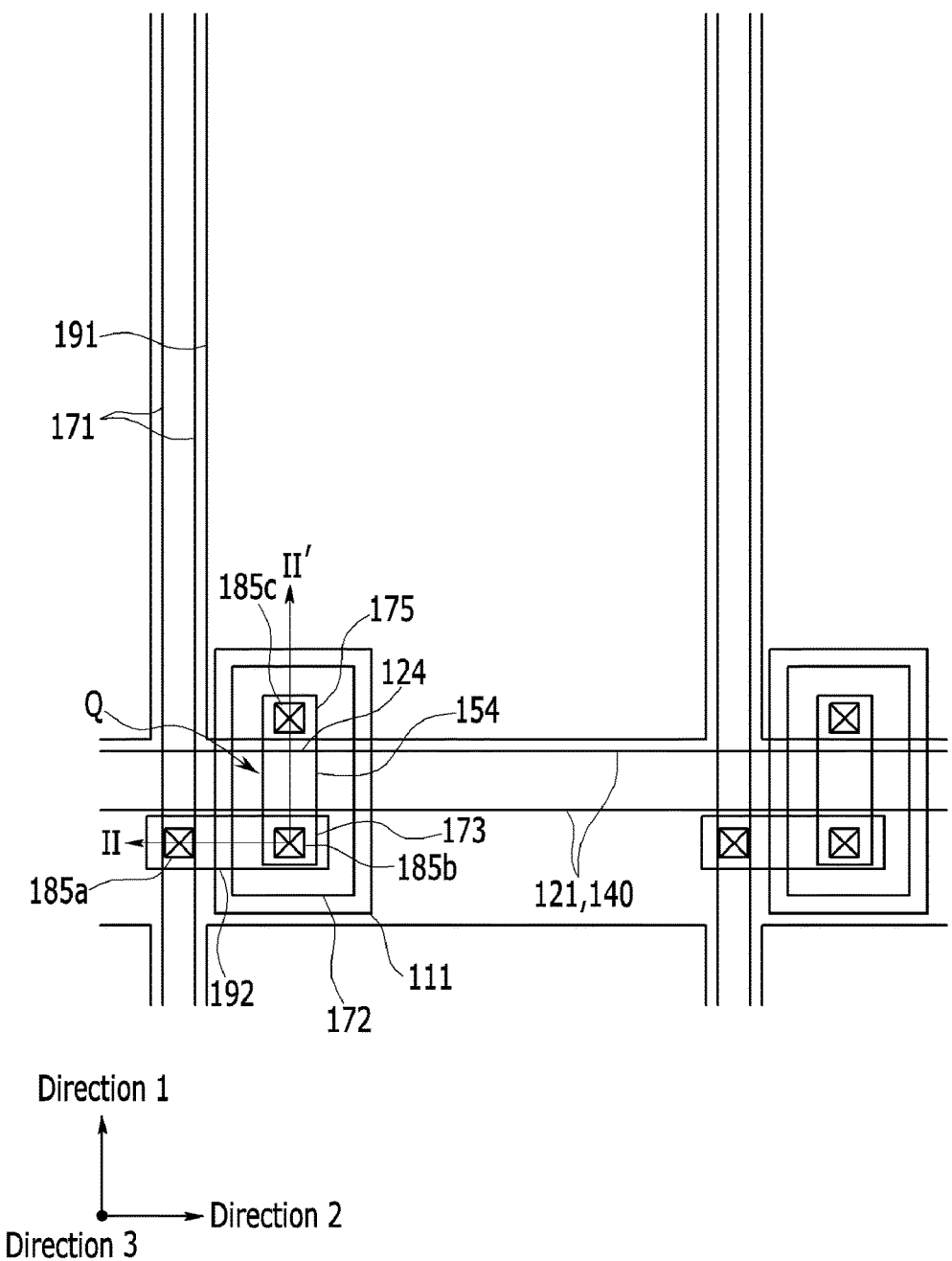
FIG. 1 is a plan view of a pixel of a display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the Direction 1-axis, the Direction 2-axis, and the Direction 3-axis are not limited to three axes of a rectangular coordinate system, and may be interpreted in a broader sense. For example, the Direction 1-axis, the Direction 2-axis, and the Direction 3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. The phrase "in a plan (or in-plane) view" refers to an orthographic projection of a three-dimensional object from the position of a horizontal plane (e.g., a plane parallel to a plane defined by the Direction 1-axis and the Direction 2-axis) above the object. The phrase "in a cross-sectional view" refers to a vantage point of a three-dimensional object from a position of a vertical plane (e.g., a plane parallel to a plane defined by the Direction 3-axis and one of the Direction 1-axis and the Direction 2-axis) through the object. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
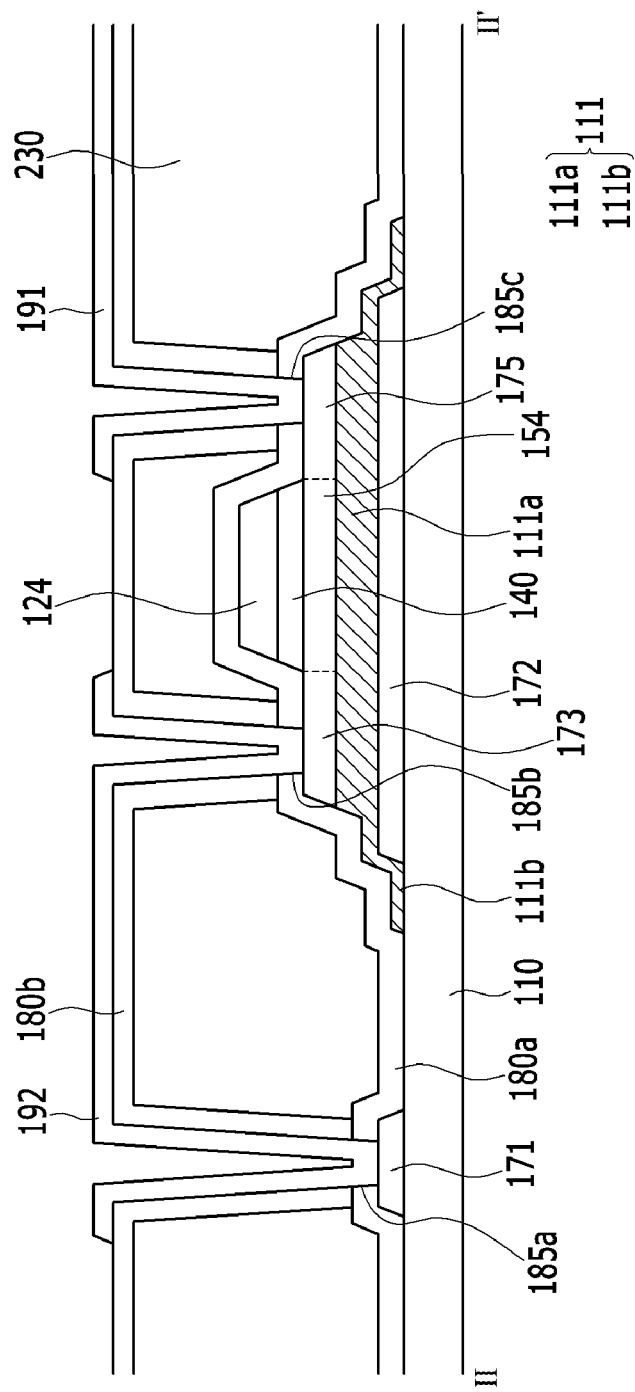
FIG. 2 is a cross-sectional view of the pixel of FIG. 1 taken along sectional line II-II', according to one or more exemplary embodiments.

A thin film transistor array panel according to one or more exemplary embodiments will now be described with reference to FIGS. 1 and 2. FIG. 1 is a plan view of a pixel of a display device, according to one or more exemplary embodiments. FIG. 2 is a cross-sectional view of the pixel of FIG. 1 taken along sectional line II-II', according to one or more exemplary embodiments.

A data line 171 and a light blocking layer 172 are disposed on a substrate 110 made of glass or plastic. The data line 171 transmits a data signal and may extend (e.g., longitudinally extend) in a first direction, e.g., Direction 1. The data line 171 may be formed with a single layer or multilayer structure, and may be made of any suitable conductive material, such as, for example, a metal, e.g., aluminum (Al), silver (Ag), copper (Cu), chromium (Cr), molybdenum (Mo), tantalum (Ta), titanium (Ti), etc., or an alloy containing one or more of the aforementioned metals. The light blocking layer 172 prevents light from reaching an oxide semiconductor layer 154 to prevent deterioration of channel characteristics of the thin film transistor, such as a leakage current. In this manner, the light blocking layer 172 is provided to overlap the thin film transistor Q.

According to one or more exemplary embodiments, the light blocking layer 172 may be provided on the same layer as the data line 171, and may be formed in a same process as the data line 171. In this manner, the light blocking layer 172 may be made with the same material as the data line 171. It is contemplated, however, that exemplary embodiments are not limited thereto or thereby. For instance, any kind of material that does not transmit a determined wavelength (or range of wavelengths) of light may be utilized in association with exemplary embodiments described herein. For example, the light blocking layer 172 may be formed of an organic insulating material or an inorganic insulating material that is different from the material used to form the data line 171. It is also contemplated that the light blocking layer 172 may be omitted. For instance, the light blocking layer 172 may be omitted when light is not input to the oxide semiconductor layer 154 through the substrate 110. For example, when the thin film transistor array panel is used for an organic light emitting device, the light blocking layer 172 may be omitted.

A buffer layer 111 is disposed on the light blocking layer 172 and overlaps with the thin film transistor Q. As shown in FIG. 1, the buffer layer 111 overlaps with the light blocking layer 172 and the thin film transistor Q. A gate line 121 may traverse the buffer layer 111. The buffer layer 111 may include a first region 111a and a second region 111b having different thicknesses from one another. According to one or more exemplary embodiments, the first region 111a may overlap the oxide semiconductor layer 154, a source electrode 173, and a drain electrode 175. The second region 111b represents a region excluding (or disposed outside of) the first region 111a.

In one or more exemplary embodiments, the first region 111a may be thicker than the second region 111b. The difference in thicknesses may be caused, at least in part, during a process for forming and etching a buffer material layer. For example, during the manufacture of the buffer layer 111, the first region 111a overlapping with the oxide semiconductor layer 154 may be protected, and, thereby, not etched during a portion of the process, whereas the second region 111b may be etched and removed during the portion of the process. The formation of the first region 111a and second region 111b will be described later in more detail.

The second region 111b may overlap with an edge of the light blocking layer 172. In this manner, the second region 111b may touch (or contact) an upper surface of the light blocking layer 172, a lateral side surface of the light blocking layer 172, and an upper surface of the substrate 110. Accordingly, a cross-section of the second region 111b may have a step shape. It is contemplated, however, that exemplary embodiments are not limited thereto or thereby. For instance, the second region 111b may only be provided on the upper surface of the light blocking layer 172.

According to one or more exemplary embodiments, the buffer layer 111 may include an insulating oxide, such as silicon nitride ($SiN_x$), silicon oxide ($SiO_x$), aluminum oxide ($Al_2O_3$), hafnium oxide ($HfO_3$), yttrium oxide ($Y_2O_3$), and/or the like. The buffer layer 111 may prevent (or at least reduce) impurities from being provided to the oxide semiconductor layer 154 from the substrate 110. In this manner, the buffer layer 111 may protect the oxide semiconductor layer 154 and improve an interface characteristic of the oxide semiconductor layer 154.

When the data line 171 or the light blocking layer 172 provided between the buffer layer 111 and the substrate 110 is made of a metal, the buffer layer 111 may have a multilayer, e.g., dual-layer, structure. For example, a first layer contacting the light blocking layer 172 of the layers of the buffer layer 111 may include silicon nitride to prevent (or at least reduce) corrosion during a manufacturing process, and a second layer contacting the oxide semiconductor layer 154 of the layers of the buffer layer 111 may include silicon oxide. The buffer layer 111 may have a thickness greater than or equal to 10 nm and less than or equal to 1000 nm, such as greater than or equal to 150 nm and less than or equal to 850 nm, e.g., greater than or equal to 400 nm and less than or equal to 600 nm. Exemplary embodiments, however, are not limited thereto or thereby.

The oxide semiconductor layer 154, the source electrode 173, and the drain electrode 175 are disposed on the buffer layer 111. The oxide semiconductor layer 154 may have a single layer or a multilayer structure including an oxide semiconductor material. The oxide semiconductor material may be a metal oxide semiconductor, and it may be configured with an oxide of a metal, such as zinc (Zn), indium (In), gallium (Ga), tin (Sn), or titanium (Ti), or a combination of a metal, such as zinc (Zn), indium (In), gallium (Ga), tin (Sn), or titanium (Ti), and their oxides. For example, the oxide semiconductor material may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), an indium-zinc-tin oxide (IZTO), and the like.

The source electrode 173 and the drain electrode 175 are disposed on respective sides of the oxide semiconductor layer 154, and are connected to the oxide semiconductor layer 154. The oxide semiconductor layer 154 may be greater than 0 Å and less than about 600 Å thick. The source electrode 173 and the drain electrode 175 connected thereto may have the same thickness as the oxide semiconductor layer 154. Exemplary embodiments, however, are not limited thereto or thereby.

The source electrode 173 and the drain electrode 175 may have conductivity, and may include the same material as the oxide semiconductor material configuring the oxide semiconductor layer 154 and a reduced semiconductor material. A metal, such as indium (In) included in the oxide semiconductor material, may be deposited on surfaces of the source electrode 173 and the drain electrode 175.

A gate insulating layer 140 is provided on the oxide semiconductor layer 154. The gate insulating layer 140 may improve the interface characteristic of the oxide semiconductor layer 154, and may prevent (or at least reduce) impurities from permeating into the oxide semiconductor layer 154. The gate insulating layer 140 may overlap the oxide semiconductor layer 154 and may not substantially overlap with the source electrode 173 or the drain electrode 175. In one or more exemplary embodiments, the gate insulating layer 140 may not overlap with the source electrode 173 and the drain electrode 175. The gate insulating layer 140 may have a thickness greater than about 1000 Å and less than about 5000 Å, such as greater than about 2000 Å and less than about 4000 Å, e.g., greater than about 2500 Å and less than about 3500 Å, but exemplary embodiments are not limited thereto or thereby. The thickness of the gate insulating layer 140 is variable based on the characteristic of the thin film transistor.

A gate electrode 124 is provided on the gate insulating layer 140. According to one or more exemplary embodiments, an edge of the gate electrode 124 may substantially overlap with an edge of the gate insulating layer 140. For instance, lateral side edges of the gate electrode 124 and the gate insulating layer 140 may be aligned (or substantially aligned) with one another. In this manner, one or more edges of the gate electrode 124 and the gate insulating layer 140 may be arranged from top to bottom.

The gate electrode 124 overlaps with the oxide semiconductor layer 154, and the oxide semiconductor layer 154 is covered by the gate electrode 124. The source electrode 173 and the drain electrode 175 are provided on respective sides of the oxide semiconductor layer 154 with respect to the gate electrode 124, and the source electrode 173 and the drain electrode 175 may not substantially overlap the gate electrode 124. In this manner, parasitic capacitance between the gate electrode 124 and the source electrode 173, or parasitic capacitance between the gate electrode 124 and the drain electrode 175, may be reduced.

The gate electrode 124 may include a metal, such as aluminum (Al), silver (Ag), copper (Cu), molybdenum (Mo), chromium (Cr), tantalum (Ta), or titanium (Ti), or alloys of one or more of the aforementioned metals. The gate electrode 124 may have a single layer or a multilayer structure. For instance, the multilayer structure may be a double layer structure including a lower layer, such as titanium (Ti), tantalum (Ta), molybdenum (Mo), or indium tin oxide (ITO), and an upper layer, such as copper (Cu). An exemplary triple layer structure may include a molybdenum (Mo)-aluminum (Al)-molybdenum (Mo) structure. It is contemplated, however, that the gate electrode 124 may be made of various sorts of metal or conductive materials in addition to the aforementioned materials.

According to one or more exemplary embodiments, the gate electrode 124, the source electrode 173, and the drain electrode 175 form a thin film transistor (TFT) Q together with the oxide semiconductor layer 154. A channel of the thin film transistor Q is provided on the oxide semiconductor layer 154.

A first passivation layer 180a is provided on the gate electrode 124, the source electrode 173, the drain electrode 175, the buffer layer 111, and the substrate 110. The first passivation layer 180a may be made of an inorganic insulating material, such as silicon nitride or silicon oxide, or an organic insulating material.

A color filter 230 may be provided on the first passivation layer 180a. The color filter 230 may correspond to one of a red color filter, a green color filter, and a blue color filter that are repeatedly provided in a first direction or a second direction. The red color filter, the green color filter, and the blue color filter respectively configure a unit pixel, and the unit pixel may display a determined color image through light output after passing through the color filter 230. The color filter 230 may be omitted in one or more exemplary embodiments. Although a combination of red, green, and blue colors has been described, it is contemplated that exemplary embodiments are not limited thereto or thereby. In this manner, the color filter 230 may include any suitable color and/or any suitable combination of colors.

A second passivation layer 180b may be provided on the color filter 230 and the first passivation layer 180a. The second passivation layer 180b may be made of an inorganic insulating material, such as silicon nitride or silicon oxide, or an organic insulating material. At least one of the first passivation layer 180a, the color filter 230, and the second passivation layer 180b may have a first contact hole 185a overlapping with a portion of the data line 171, a second contact hole 185b overlapping with a portion of the source electrode 173, and a third contact hole 185c overlapping with a portion of the drain electrode 175.

A pixel electrode 191 and a connection electrode 192 may be provided on the second passivation layer 180b. The connection electrode 192 electrically connects the data line 171 and the source electrode 173 through the first contact hole 185a and the second contact hole 185b. The connection electrode 192 transmits a data signal provided by the data line 171 to the source electrode 173.

The pixel electrode 191 is physically and electrically connected to the drain electrode 175 through the third contact hole 185c. In one or more exemplary embodiments, the pixel electrode 191 is directly connected to the drain electrode 175 through the third contact hole 185c. It is contemplated, however, that exemplary embodiments are not limited thereto or thereby. For instance, the pixel electrode 191 may be physically and electrically connected to the drain electrode 175 through a connection electrode (not shown).

Figure 3:
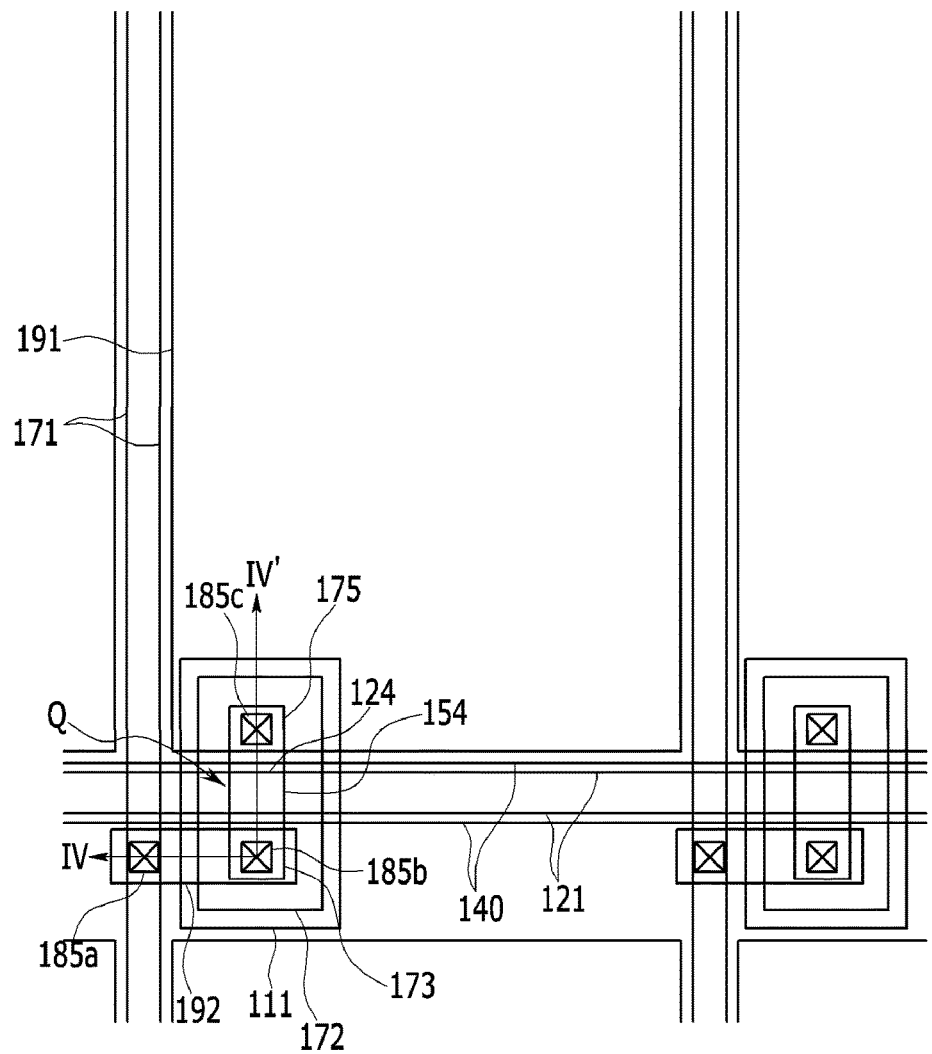
FIG. 3 is a plan view of a pixel of a display device, according to one or more exemplary embodiments.
Figure 4:
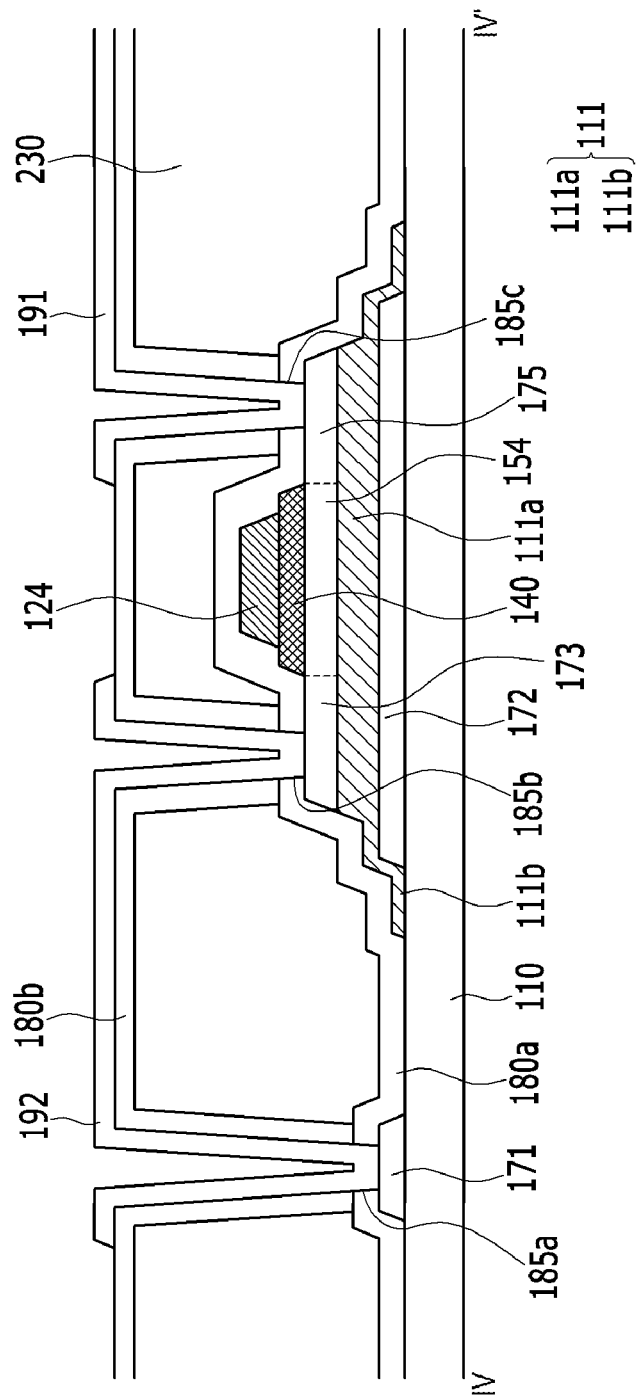
FIG. 4 is a cross-sectional view of the pixel of FIG. 3 taken along sectional line IV-IV', according to one or more exemplary embodiments.

FIG. 3 is a plan view of a pixel of a display device, according to one or more exemplary embodiments. FIG. 4 is a cross-sectional view of the pixel of FIG. 3 taken along sectional line IV-IV', according to one or more exemplary embodiments. The structure and configuration of the pixel of FIGS. 3 and 4 is similar to the structure and configuration of the pixel of FIGS. 1 and 2. As such, duplicative descriptions will be omitted to avoid obscuring exemplary embodiments described herein. Primarily differences will be described below.

As seen in FIGS. 3 and 4, the thin film transistor array panel includes a gate insulating layer 140 and a gate electrode 124 disposed on an oxide semiconductor layer 154. In one or more exemplary embodiments, first edges (e.g., lateral side edges) of the gate electrode 124 extending in Direction 2 may be spaced apart from and to the "inside" of first edges (e.g., lateral side edges) of the gate insulating layer 140 extending in Direction 2. That is, a width of the gate insulating layer 140 in Direction 1 may be greater than a width of the gate electrode 124 in the first direction.

As previously described, a width of the gate electrode 124 is smaller than a width of the gate insulating layer 140. In this manner, a gap between the gate electrode 124 and the source electrode 173, or between the gate electrode 124 and the drain electrode 175, may be increased. To this end, parasitic capacitance between the gate electrode 124 and the source electrode 173, or between the gate electrode 124 and the drain electrode 175, may be reduced. When the parasitic capacitance is reduced, an on/off characteristic of the thin film transistor may be improved.

Figure 5:
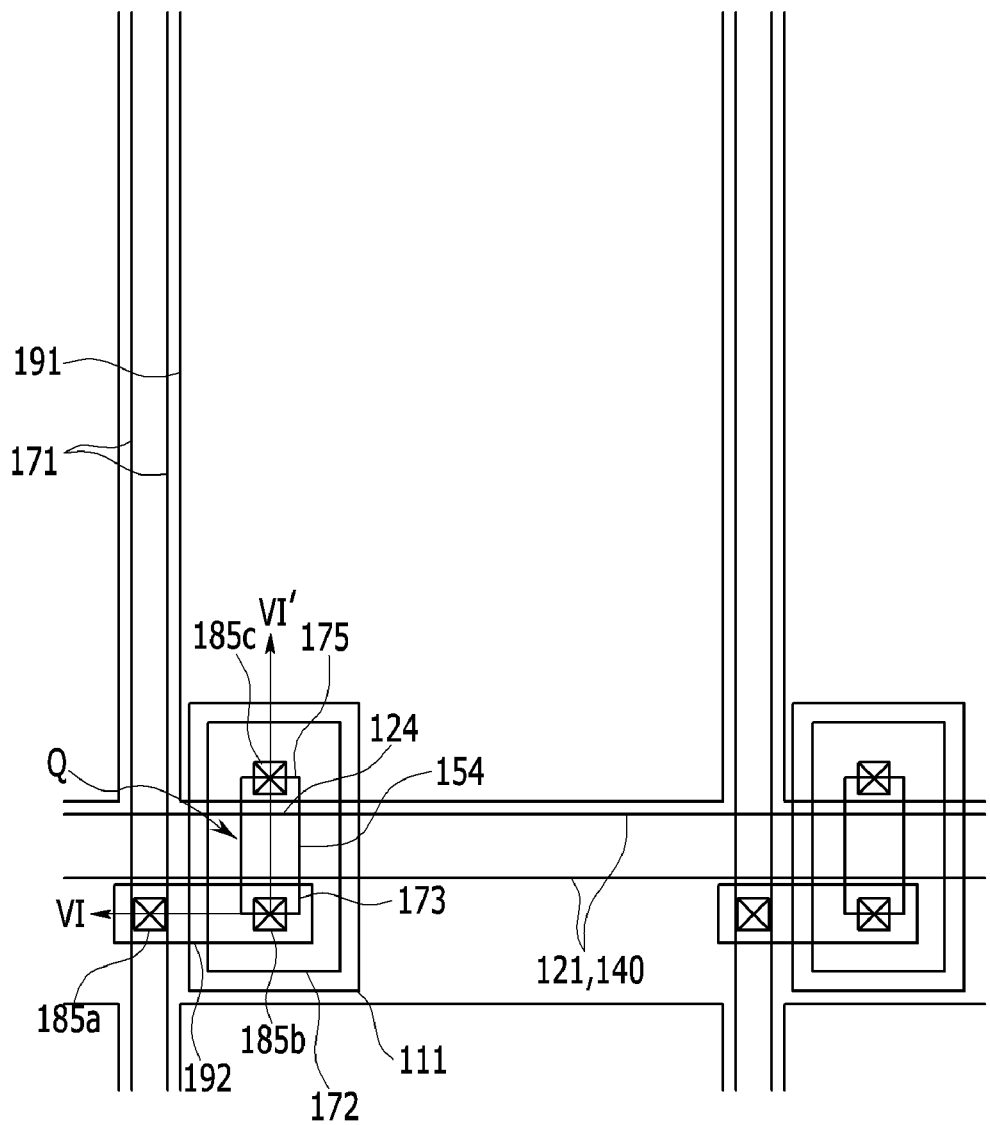
FIG. 5 is a plan view of a pixel of a display device, according to one or more exemplary embodiments.
Figure 6:
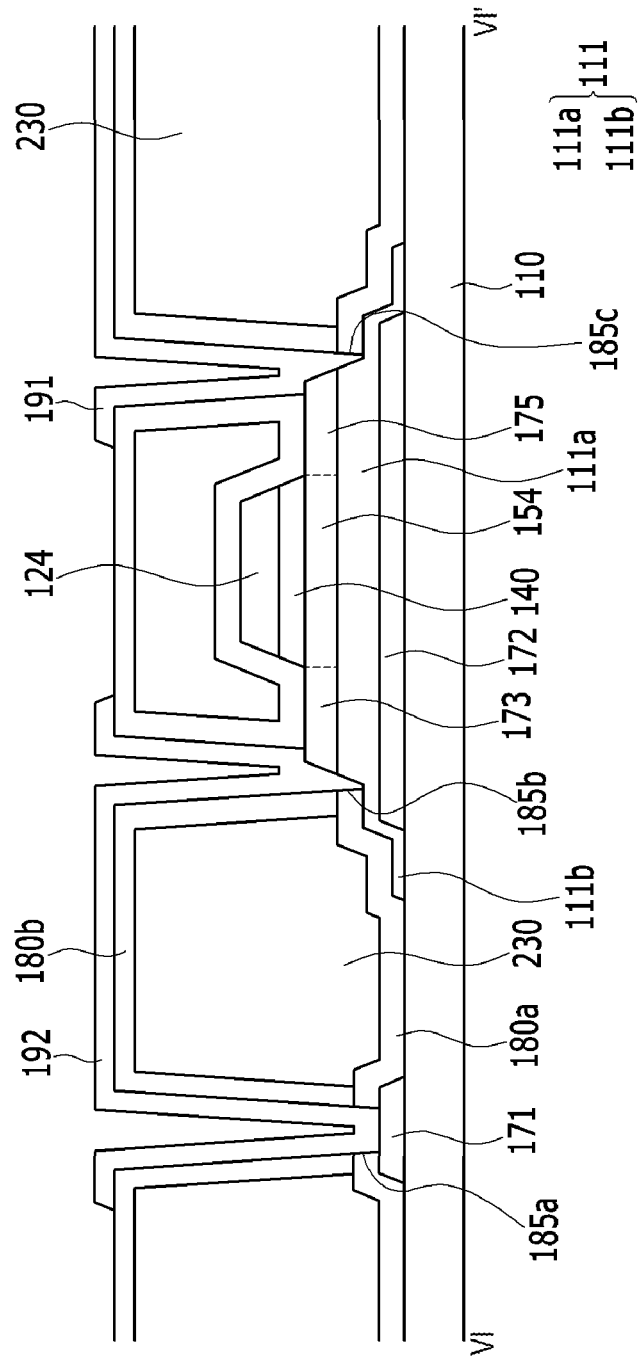
FIG. 6 is a cross-sectional view of the pixel of FIG. 5 taken along sectional line VI-VI', according to one or more exemplary embodiments.

FIG. 5 is a plan view of a pixel of a display device, according to one or more exemplary embodiments. FIG. 6 is a cross-sectional view of the pixel of FIG. 5 taken along sectional line VI-VI', according to one or more exemplary embodiments. The structure and configuration of the pixel of FIGS. 5 and 6 is similar to the structure and configuration of the pixel of FIGS. 1 and 2. As such, duplicative descriptions will be omitted to avoid obscuring exemplary embodiments described herein. Primarily differences will be described below.

Referring to FIGS. 5 and 6, a second contact hole 185b and a third contact hole 185c may respectively overlap with edges (e.g., lateral side edges) of the source electrode 173 and the drain electrode 175. It is noted that portions of the second contact hole 185b and the third contact hole may respectively overlap with upper surfaces of the source electrode 173 and the drain electrode 175. By allowing the second contact hole 185b and the third contact hole 185c to at least respectively overlap with the edges of the source electrode 173 and the drain electrode 175, the respective widths of the source electrode 173 and the drain electrode 175 in Direction 1 (e.g., regions connected to the connection electrode 192 or the pixel electrode 191), may be reduced. As such, contact margins may be achieved, e.g., a larger margin of placement error may be achieved. In this manner, the configuration of FIGS. 5 and 6 may prevent a disconnection caused by a misalignment that may occur during the manufacturing process. In addition, the configuration of FIGS. 5 and 6 may minimize (or at least reduce) a margin (or space) of a unit pixel area. As such, a greater number of pixels may be disposed in a unit area.

A method for manufacturing a thin film transistor array panel according to one or more exemplary embodiments will now be described with reference to FIGS. 7 to 15. FIGS. 7 to 15 are cross-sectional views of a thin film transistor array panel at various stages of manufacture, according to one or more exemplary embodiments. For illustrative and descriptive convenience, the process of manufacturing a thin film transistor will be described with reference to the thin film transistor of FIGS. 1 and 2.

Figure 7:
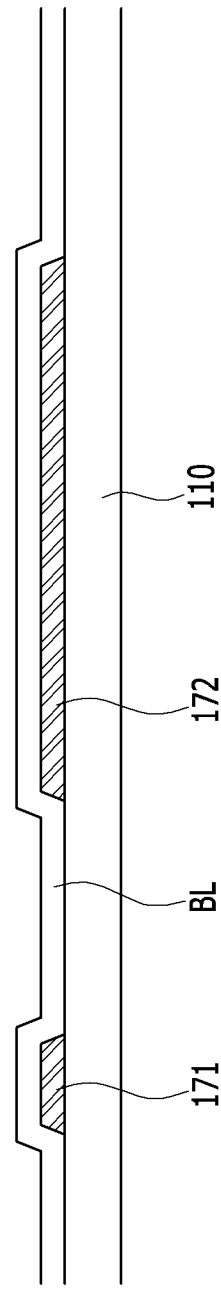
FIGS. 7, 8, 9, 10, 11, 12, 13, 14, and 15 are cross-sectional views of a thin film transistor array panel at various stages of manufacture, according to one or more exemplary embodiments.

Referring to FIG. 7, a data conductive layer is formed on a substrate 110 and is patterned to form a data line 171 and a light blocking layer 172. A buffer material layer (BL) is formed on the substrate 110, the data line 171, and the light blocking layer 172. It is noted that the light blocking layer 172 may be omitted depending on one or more exemplary embodiments.

In one or more exemplary embodiments, the data line 171 and the light blocking layer 172 are formed according to the same process, and without being limited to or by the aforementioned process, it may also be possible to generate the data line 171 by providing a light blocking layer 172 made of an organic insulating material and an inorganic insulating material, stacking metals, and patterning the same. Further, an order of formation of the light blocking layer 172 and the data line 171 may be changed.

The buffer material layer BL may be formed using any suitable process, such as for example, chemical vapor deposition (CVD). In this manner, the buffer material layer BL may include an insulating oxide, such as silicon nitride ($SiN_x$), silicon oxide ($SiO_x$), aluminum oxide ($Al_2O_3$), hafnium oxide ($HfO_3$), or yttrium oxide ($Y_2O_3$). The buffer material layer BL may have a thickness greater than or equal to 10 nm and less than or equal to 1000 nm, such as greater than or equal to 150 nm and less than or equal to 850 nm, e.g., greater than or equal to 400 nm and less than or equal to 600 nm. It is contemplated, however, that the buffer material layer BL is not restricted to the aforementioned manufacturing method, material, and/or thickness. In this manner, any suitable manufacturing method(s), material(s), and/or thickness(es) for protecting the oxide semiconductor layer 154 may be utilized in association with exemplary embodiments described herein.

Figure 8:
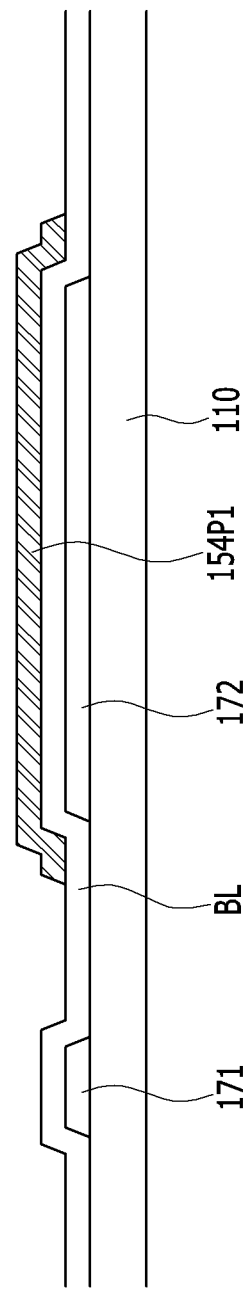

Referring to FIG. 8, an oxide semiconductor material layer is formed on the buffer material layer BL, and, then, patterned to form a first oxide semiconductor pattern 154P1. The first oxide semiconductor pattern 154P1 may be patterned to overlap with the light blocking layer 172. The first oxide semiconductor pattern 154P1 may be made of an oxide semiconductor material. The oxide semiconductor material may be a metal oxide semiconductor. The metal oxide semiconductor material may be an oxide of a metal, such as zinc (Zn), indium (In), gallium (Ga), tin (Sn), or titanium (Ti), or a combination of a metal, such as zinc (Zn), indium (In), gallium (Ga), tin (Sn), or titanium (Ti), and their oxides. For example, the oxide semiconductor material may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), an indium-zinc-tin oxide (IZTO), and the like.

Figure 9:
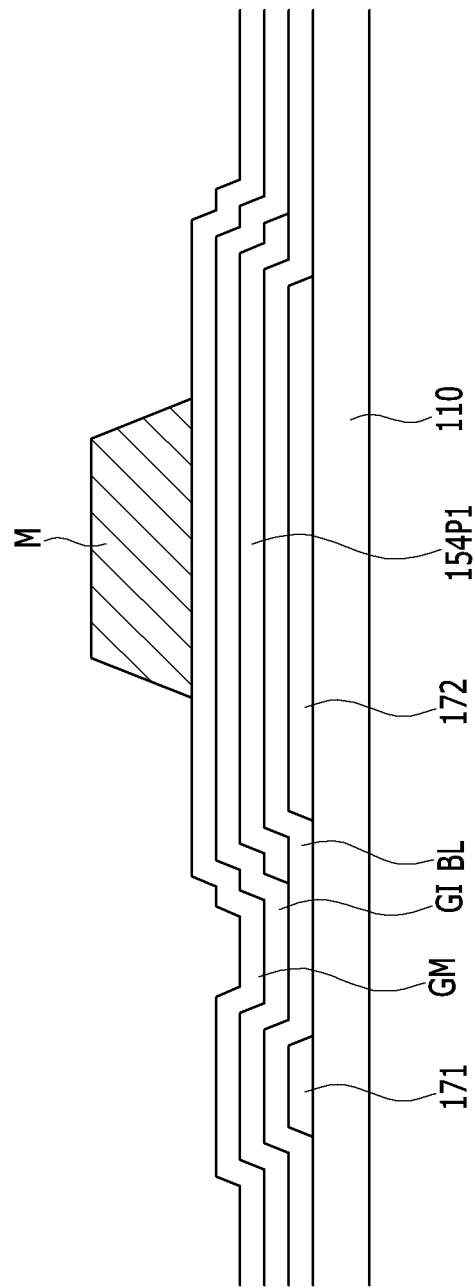

Referring to FIG. 9, a gate insulating layer material layer GI formed of an insulating material and a gate conductive layer GM formed of conductive material are formed on the buffer material layer BL and the first oxide semiconductor pattern 154P1. A mask pattern M for patterning the gate conductive layer GM and the gate insulating layer material layer GI is formed on the gate conductive layer GM.

Figure 10:
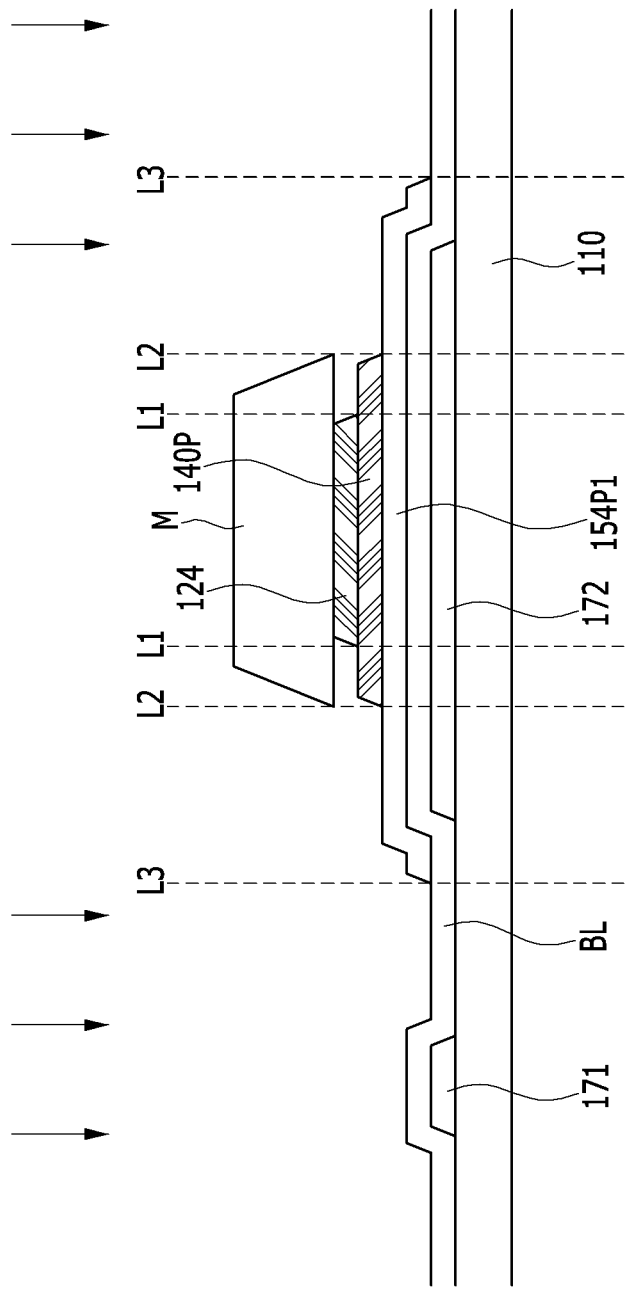

As shown in FIG. 10, the gate conductive layer GM is wet-etched to form a gate electrode 124, and the gate insulating layer material layer GI is etched to form a gate insulating layer pattern 140P. The gate electrode 124 and the gate insulating layer pattern 140P are formed to traverse and pass over a central portion of the first oxide semiconductor pattern 154P1, and two regions of the first oxide semiconductor pattern 154P1 provided on respective sides of the central portion where the gate electrode 124 overlaps with the first oxide semiconductor pattern 154P1 do not overlap with the gate electrode 124. For example, a first lateral edges of the gate electrode 124 may be formed at virtual lines L1, first lateral edges of the gate insulating layer pattern 140P may be formed at virtual lines L2, and first lateral edges of the first oxide semiconductor pattern 154P1 may be formed at virtual lines L3. As seen in FIG. 10, virtual lines L1 and L2 may be disposed between virtual lines L3, and virtual lines L2 may be disposed between virtual lines L1 and virtual lines L3.

Figure 11:
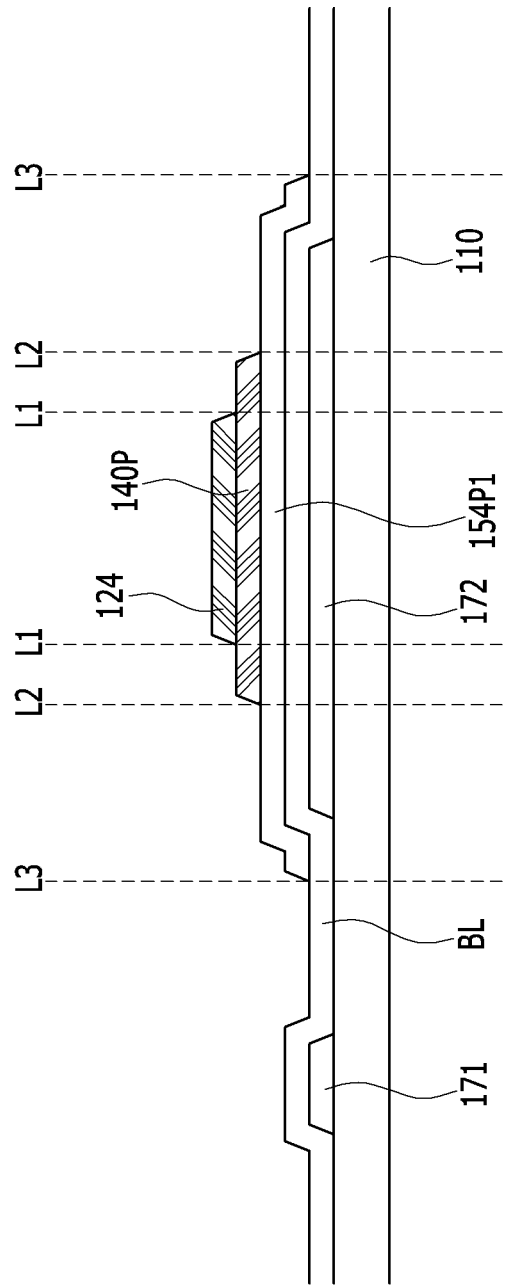
Figure 12:
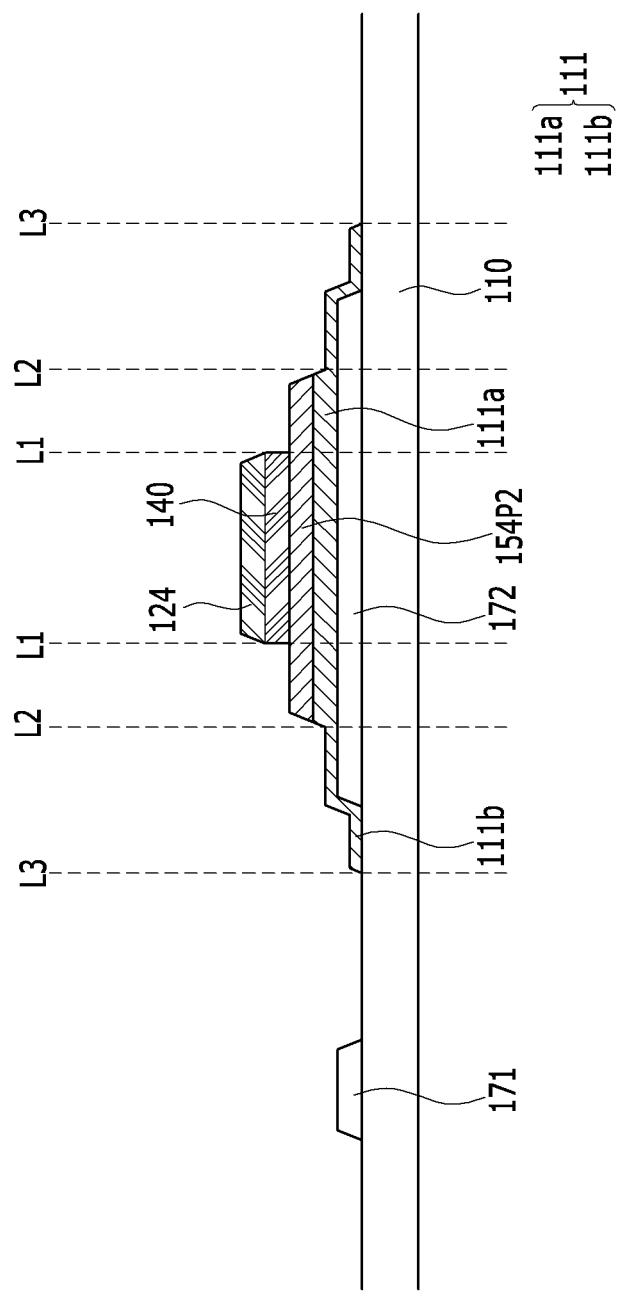

Adverting to FIG. 11, the mask pattern M formed on the gate electrode 124 may be removed and additional etching may be performed, as described in association with FIG. 12.

As shown in FIG. 12, through the additional etching process, a portion of the gate insulating layer pattern 140P provided between the virtual lines L1 and L2 is removed (e.g., completely removed) to form a gate insulating layer 140, a portion of the first oxide semiconductor pattern 154P1 provided between the virtual lines L2 and L3 is removed (e.g., completely removed) to form a second oxide semiconductor pattern 154P2, and a portion of the buffer material layer BL disposed outside of an area disposed between virtual lines L3 is removed (e.g., completely removed) to form a buffer layer 111. The buffer layer 111 is formed in a region overlapping with the first oxide semiconductor pattern 154P1.

According to one or more exemplary embodiments, a portion of the buffer material layer BL provided in the region overlapping with the second oxide semiconductor pattern 154P2 is not removed to form a first region 111a of buffer layer 111. First region 111a includes a first determined thickness. A portion of the buffer material layer BL provided between the virtual lines L2 and L3 is partly removed according to an etching selection ratio during a process for removing a portion of the first oxide semiconductor pattern 154P1. In this manner, a second region 111b of buffer layer 111 is formed with a second determined thickness, the second thickness being less than the first thickness of the first region 111a.

As previously described, portions of the buffer material layer BL that do not overlap with the first oxide semiconductor pattern 154P1 are removed. That is, a portion of the buffer material layer BL overlapping with the data line 171 is removed. In this manner, the buffer layer 111 may not overlap with the data line 171.

Figure 13:
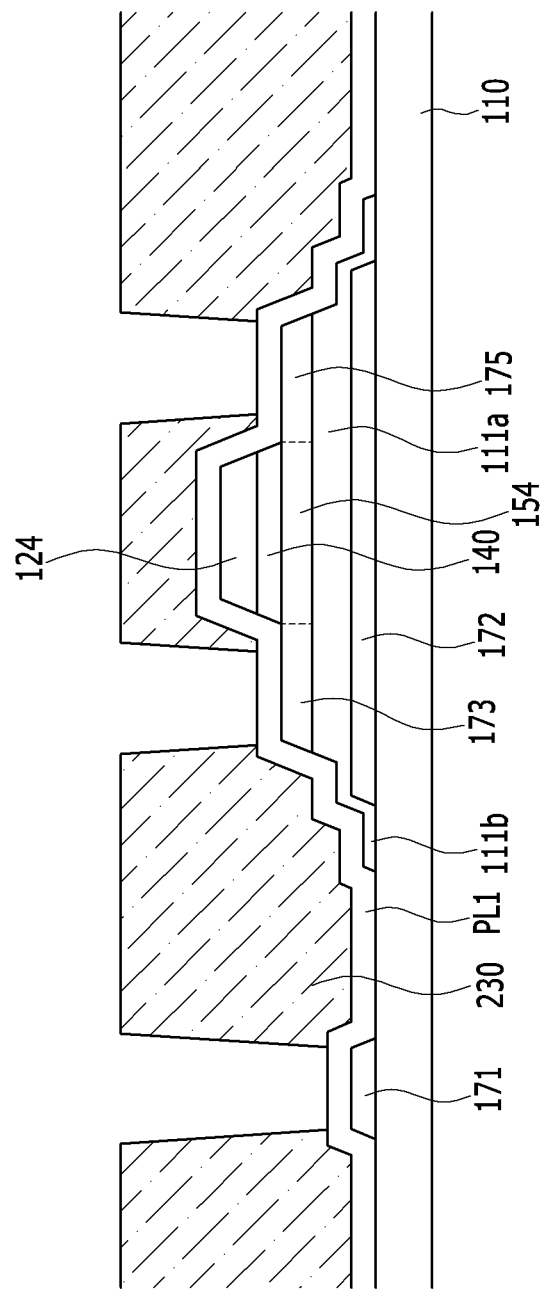

Referring to FIG. 13, two regions that do not overlap with the gate electrode 124 and the gate insulating layer 140 are reduced in the second oxide semiconductor pattern 154P2 to form a source electrode 173 and a drain electrode 175 having conductivity. The second oxide semiconductor pattern 154P2 that overlaps the gate electrode 124 and the gate insulating layer 140 and that is not reduced becomes the oxide semiconductor layer 154 configuring a channel of a thin film transistor.

According to one or more exemplary embodiments, the method for reducing the second oxide semiconductor pattern 154P2 may be a heat treatment method in a reduction atmosphere, and may be a plasma processing method using gas plasma, such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), or fluoroform ($CHF_3$). At least part of the semiconductor material that is reduced and configures the second oxide semiconductor pattern 154P2 may be reduced so that a metallic bond may remain. In this manner, the reduced portions of second oxide semiconductor pattern 154P2 have conductivity and form the source electrode 173 and drain electrode 175. The gate electrode 124, the source electrode 173, the drain electrode 175, and the oxide semiconductor layer 154 configure a thin film transistor Q.

Referring to FIG. 13, a first passivation material layer PL1 is formed to cover the gate electrode 124, the source electrode 173, and the drain electrode 175. One or more color filter materials are formed on the first passivation material layer PL1. The one or more color filter materials are patterned to remove portions of the one or more color filter materials disposed in areas where a first contact hole 185a, a second contact hole 185b, and a third contact hole 185c will be formed. In this manner, the color filter 230 is formed.

Figure 14:
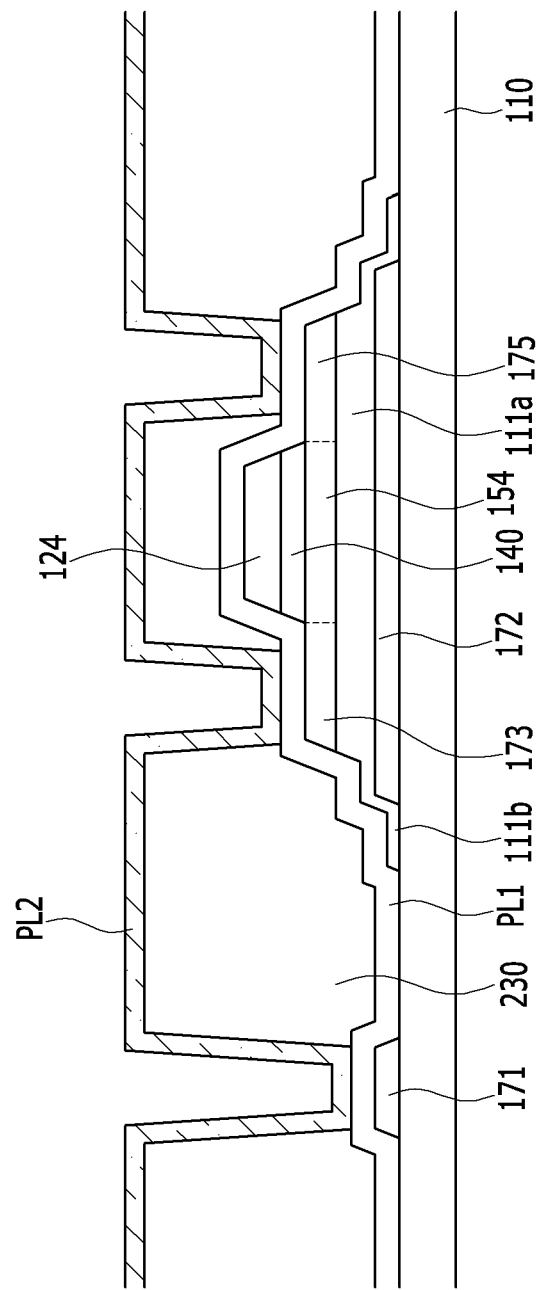

As shown in FIG. 14, a second passivation material layer PL2 is formed on the color filter 230. The second passivation material layer PL2 may be formed of the same or a different material as/from the first passivation material layer PL1.

Figure 15:
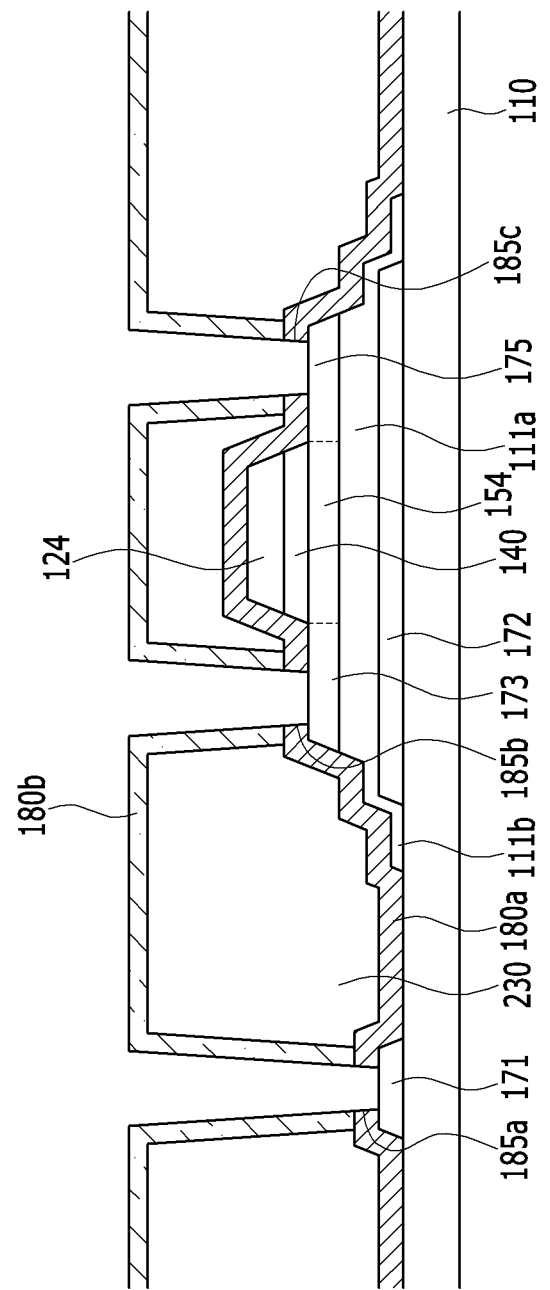

Adverting to FIG. 15, the second passivation material layer PL2 and the first passivation material layer PL1 are patterned to form a second passivation layer 180b and a first passivation layer 180a including a first contact hole 185a overlapping with a portion of the data line 171, a second contact hole 185b overlapping with a portion of the source electrode 173, and a third contact hole 185c overlapping with a portion of the drain electrode 175. The second passivation material layer PL2 and the first passivation material layer PL1 may be patterned through a dry etching process.

A conductive layer is applied to the second passivation layer 180b and is then patterned to form a connection electrode 192 for connecting the data line 171 and the source electrode 173 through the first contact hole 185a and the second contact hole 185b, and to form a pixel electrode 191 connected to the drain electrode 175 through the third contact hole 185c. In this manner, the thin film transistor array panel of FIGS. 1 and 2 may be formed.

According to one or more exemplary embodiments, a method for manufacturing a thin film transistor array panel with reference to FIGS. 7 to 15 forms a gate electrode and a gate insulating pattern through first etching, removes the mask pattern, and performs second etching with the gate electrode as a mask. With respect to the second etching, a gate insulating layer is formed, a second oxide semiconductor pattern for forming a source electrode and a drain electrode is formed, and a buffer layer from which a determined region is removed so as to not overlap with the data line is formed.

In the above-described method for manufacturing a thin film transistor array panel, the first passivation material layer PL1 and the second passivation material layer PL2 are removed so as to form the contact holes. That is, when the first contact hole 185a, the second contact hole 185b, and the third contact hole 185c are formed, the first passivation material layer PL1 and the second passivation material layer PL2 are etched. As described, the same material layer is simultaneously etched when a plurality of contact holes are simultaneously generated, so the respective contact holes may be generated with the same etching ratio. That is, when the first contact hole 185a overlapping with a portion of the data line 171 is formed, the buffer material layer disposed on the portion overlapping with the data line 171 is already removed so when the first contact hole 185a overlapping with the portion of the data line 171 is formed. As such, the same material as the etching process for forming the second contact hole 185b and the third contact hole 185c may be removed.

When the first contact hole 185a overlaps with the buffer material layer BL, and the second contact hole 185b and the third contact hole 185c are formed, the buffer material layer BL overlapping with the first contact hole 185a must be additionally etched, so while the buffer material layer BL is etched during the additional etching process, surfaces of the source electrode 173 and the drain electrode 175 overlapping with the second contact hole 185b and the third contact hole 185c may be damaged, which will now be described in more detail.

When the buffer material layer BL overlapping with the data line 171 is not removed, differing from exemplary embodiments described herein, the buffer material layer BL, the first passivation material layer PL1, and the second passivation material layer PL2 must be etched so as to generate the first contact hole 185a, and the first passivation material layer PL1 and the second passivation material layer PL2 must be etched so as to generate the second contact hole 185b and the third contact hole 185c. When the first passivation material layer PL1 and the second passivation material layer PL2 are etched, the buffer material layer BL is provided in the region in which the first contact hole 185a will be formed, and an oxide semiconductor layer 154 (or a reduced oxide semiconductor layer, that is, a source electrode 173 and a drain electrode 175) is provided in the region in which the second and third contact holes 185b and 185c will be provided. Accordingly, when the buffer material layer BL is etched so as to generate the first contact hole 185a, the oxide semiconductor layer 175 must be etched. In order to minimize damage of the oxide semiconductor layer 154, a selecting etching ratio of at least 40:1 is required, but such a highly selective etching ratio is difficult to maintain. Further, when the second passivation material layer PL2 is an organic material, and the buffer material layer BL is being etched, the second passivation material layer PL2 that is an organic layer and the oxide semiconductor layer 154 may be damaged.

According to one or more exemplary embodiments, however, the buffer material layer BL is removed from the portion in which the first contact hole 185a overlaps with the data line 171, such that the first contact hole 185a, the second contact hole 185b, and the third contact hole 185c may be formed according to the same etch condition. In this manner, the processing conditions are made simpler, the source electrode 173 and the drain electrode 175 are prevented (or at least reduced) from being damaged during the etching processing, and a thin film transistor Q having improved reliability is provided.

As described, when the buffer material layer BL is removed from the location in which the first contact hole 185a is to be formed according to one or more exemplary embodiments, an etching process with a relatively high selection ratio is not necessary to form a contact hole. In this manner, the etch processing is simplified, the thin film transistor Q is prevented (or at least reduced) from being damaged, and reliability is maintained or improved.

Although one or more exemplary embodiments have been described with respect to a buffer material layer BL being removed in a region excluding the region overlapping with the thin film transistor Q, exemplary embodiments are not limited thereto or thereby. For instance, in one or more exemplary embodiments, another thin buffer material layer may be formed on the substrate 110 to protect various portions of the thin film transistor. As such, a contact hole may be formed without damaging the thin film transistor even though a relatively low etching selection ratio of 1:5 to 1:20 is utilized instead of the above-noted relatively high etching selection ratio of 40:1.

Figure 16:
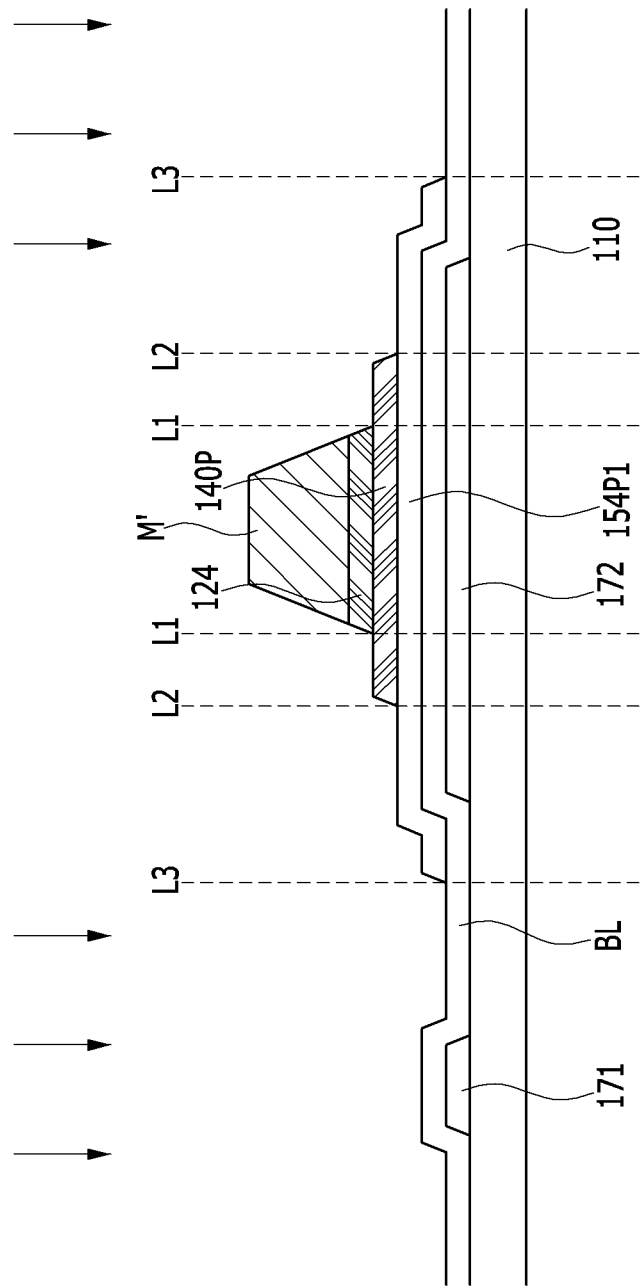
FIGS. 16 and 17 are cross-sectional views of a thin film transistor array panel at various stages of manufacture, according to one or more exemplary embodiments.
Figure 17:
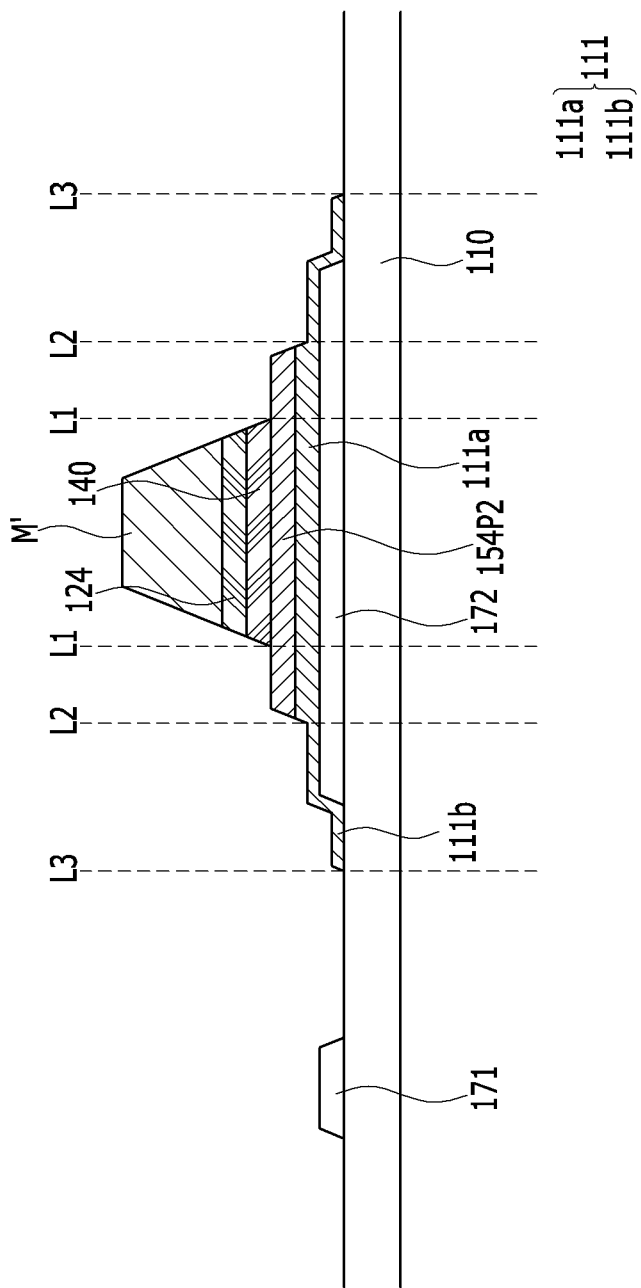

FIGS. 16 and 17 are cross-sectional views of a thin film transistor array panel at various stages of manufacture, according to one or more exemplary embodiments. For illustrative and descriptive convenience, the process of manufacturing a thin film transistor will be described with reference to the thin film transistor of FIGS. 3 and 4. The manufacturing process descried in association with FIGS. 16 and 17 is similar to the manufacturing process of FIGS. 7 to 15. As such, duplicative descriptions will be omitted to avoid obscuring exemplary embodiments described herein. Primarily differences will be described below.

The manufacturing process described in association with FIGS. 16 and 17 may utilize the manufacturing process steps described in association with FIGS. 7 to 10. As shown in FIG. 16, however, a mask pattern M', of which a portion is ashed, is formed. Lateral side edges of the mask pattern M' may be formed at virtual lines L1 corresponding to the lateral side edges of the gate electrode 124. Exemplary embodiments, however, are not limited to or by the ashing method to form the mask pattern M'. For instance, oxygen plasma processing may be used, as may any other suitable manufacturing process.

Referring to FIG. 17, through an additional etch process, the gate insulating layer pattern 140P provided between virtual lines L1 and L2 is removed to form a gate insulating layer 140. In this manner, the lateral edges of the gate insulating layer 140 may correspond to (or be aligned with) the lateral side edges of the gate electrode 124. That is, widths of the gate electrode 124 and the gate insulating layer 140 in Direction 1 may substantially correspond to each other, and the gate electrode 124 and the gate insulating layer 140 may have substantially the same flat shape as one another. To this end, the first oxide semiconductor pattern 154P1 provided between virtual lines L2 and L3 is removed to form a second oxide semiconductor pattern 154P2. The buffer material layer BL disposed in a region outside of a region between virtual lines L3 is removed to form a buffer layer 111. The buffer layer 111 is provided in the region overlapping with the first oxide semiconductor pattern 154P1.

According to one or more exemplary embodiments, a portion of the buffer material layer BL provided in the region overlapping with the second oxide semiconductor pattern 154P2 is not removed to form a first region 111a with a first determined thickness. A portion of the buffer material layer BL provided between virtual lines L2 and L3 is removed according to the etching selection ratio in the process for removing the first oxide semiconductor pattern 154P1. In this manner, the second region 111b of the buffer layer 111 is formed thinner than the first region 111a of the buffer layer.

The mask pattern M' is removed, and the manufacturing process described in association with FIGS. 16 and 17 may include the manufacturing process steps described in association with FIGS. 13 to 15.

The method for manufacturing a thin film transistor array panel with reference to FIGS. 16 and 17 forms a gate electrode and a gate insulating pattern through first etching, part of the mask pattern is ashed, and a gate insulating layer formed in correspondence with the gate electrode is formed using the ashed mask pattern. Further, a second oxide semiconductor pattern may be formed using the gate insulating pattern, and a buffer layer may be formed using the first oxide semiconductor pattern.

Figure 18:
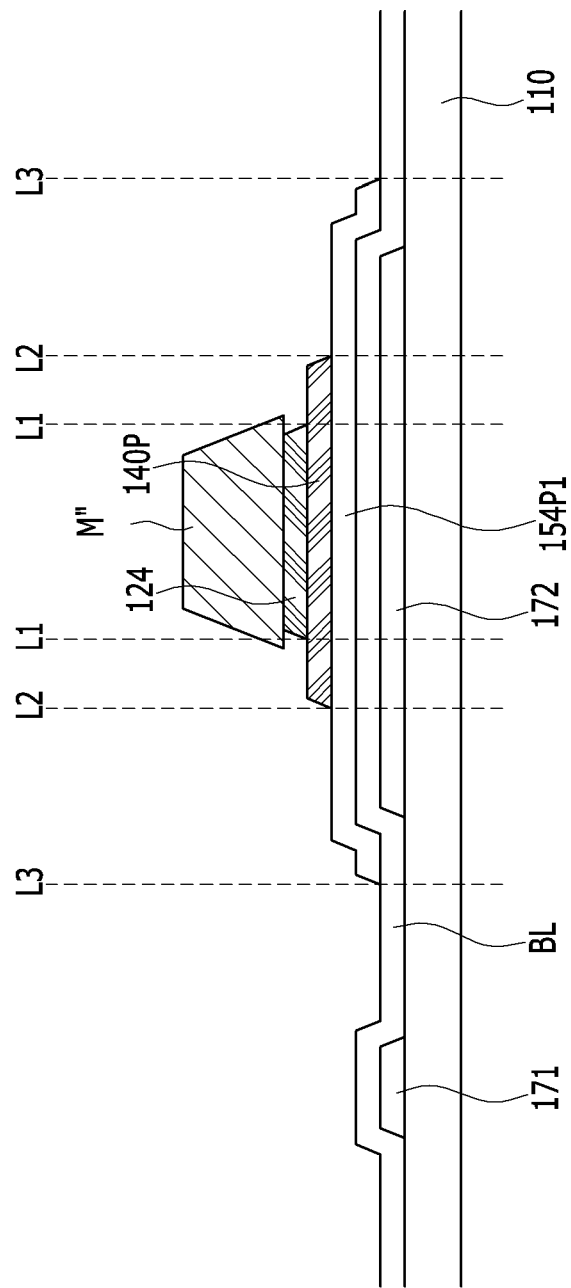

FIGS. 18 and 19 are cross-sectional views of a thin film transistor array panel at various stages of manufacture, according to one or more exemplary embodiments. For illustrative and descriptive convenience, the process of manufacturing a thin film transistor will be described with reference to the thin film transistor of FIGS. 5 and 6. The manufacturing process descried in association with FIGS. 18 and 19 is similar to the manufacturing process of FIGS. 7 to 15. As such, duplicative descriptions will be omitted to avoid obscuring exemplary embodiments described herein. Primarily differences will be described below.

The manufacturing process described in association with FIGS. 16 and 17 may utilize the manufacturing process steps described in association with FIGS. 7 to 10. As shown in FIG. 18, however, a portion of the mask pattern M" is ashed so that lateral edges of the mask pattern M" may be provided between virtual lines L1 corresponding to lateral side edges of the gate electrode 124 and virtual lines L2 corresponding to lateral side edges of the gate insulating layer pattern 140P. Exemplary embodiments, however, are not limited to or by the ashing method to form the mask pattern M". For instance, oxygen plasma processing may be used, as may any other suitable manufacturing process.

Referring to FIG. 19, when an additional etching is performed with an ashed mask pattern M", lateral side edges of the gate insulating layer pattern 140P formed between corresponding lateral side edges of the mask pattern M" and virtual line L2 is removed to generate a gate insulating layer 140 formed in correspondence with the lateral side edges of the ashed mask pattern M". A portion of the first oxide semiconductor pattern 154P1 provided between virtual lines L2 and L3 is removed to generate a second oxide semiconductor pattern 154P2. The buffer material layer BL provided outside a region disposed between virtual lines L3 is removed to form a buffer layer 111 overlapping with the light blocking layer 172. The buffer layer 111 is provided in a region overlapping with the first oxide semiconductor pattern 154P1, and a portion of the buffer material layer BL overlapping with the data line 171 is removed. In this manner, the buffer layer 111, according to one or more exemplary embodiments, may not overlap with the data line 171.

A portion of the buffer material layer BL provided in a region overlapping with the second oxide semiconductor pattern 154P2 is not removed to form a first region 111a with a first determined thickness. A portion of the buffer material layer BL provided between virtual lines L2 and L3 is partly removed by the etching selection ratio during the process for removing the first oxide semiconductor pattern 154P1. In this manner, a second region 111b of the buffer layer 111 is formed thinner than the first region 111a of the buffer layer 111. Further, a lateral side edges of the gate insulating layer 140 may be disposed past (e.g., extend beyond) lateral side edges of the gate electrode 124. That is, a width of the gate electrode 124 may be less than a width of the gate insulating layer 140.

The mask pattern M" is removed, and the manufacturing process described in association with FIGS. 18 and 19 may include the manufacturing process steps described in association with FIGS. 13 to 15.

The method for manufacturing a thin film transistor array panel with reference to FIGS. 18 and 19 includes forming a gate electrode and a gate insulating pattern through a first etching process using a mask pattern, and forming a gate insulating layer with a greater width than the gate electrode through a second etching process using a partly-ashed mask. The manufacturing method may include forming a second oxide semiconductor pattern using the gate insulating pattern, and forming a buffer layer using a first oxide semiconductor pattern. In this manner, an ashing amount of the mask pattern may be less than an ashing amount of the mask pattern of FIGS. 16 and 17. A width of the ashed mask pattern M" in a first direction described with reference to FIGS. 18 and 19 may be greater than a width of the ashed mask pattern M' in the first direction described with reference to FIGS. 16 and 17.

According to one or more exemplary embodiments, a thin film transistor array panel may be formed including a thin film transistor. A thin film transistor of the thin film transistor array may have improved reliability, which may improve the reliability of a device including the thin film transistor array panel. Further, the thin film transistor may be formed in a narrower region, enabling a display device including the thin film transistor array to have an improved aperture ratio and charging ratio. According to the method for manufacturing a thin film transistor array panel, a simplified manufacturing process may be provided, and damage to the thin film transistor that might otherwise occur during the manufacturing process may be prevented (or at least reduced).

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor array panel comprising:
   a substrate;
   a data line disposed on the substrate;
   a buffer layer disposed on the substrate and spaced apart from the data line in a plan view;
   a thin film transistor overlapping the buffer layer in a direction of the plan view, the thin film transistor comprising an oxide semiconductor layer; and
   a pixel electrode connected to the thin film transistor.

2. The thin film transistor array panel of claim 1, further comprising:
   a light blocking layer disposed on a same layer as the data line, the light blocking layer overlapping the thin film transistor,
   wherein the buffer layer overlaps the light blocking layer.

3. The thin film transistor array panel of claim 2, wherein:
   the buffer layer comprises a first region and a second region;
   thicknesses of the first and second regions are different; and
   the second region overlaps an edge of the light blocking layer.

4. The thin film transistor array panel of claim 3, wherein the thin film transistor further comprises:
   a source electrode disposed on a same layer as the oxide semiconductor layer, the source electrode being connected to a first side of the oxide semiconductor layer;

a drain electrode disposed on the same layer as the oxide semiconductor layer, the drain electrode being connected to a second side of the oxide semiconductor layer; and a gate electrode overlapping the oxide semiconductor layer.

5. The thin film transistor array panel of claim 4, wherein the source electrode and the drain electrode comprise a material reduced from the oxide semiconductor layer.

6. The thin film transistor array panel of claim 4, wherein the first region overlaps the oxide semiconductor layer, the source electrode, and the drain electrode.

7. The thin film transistor array panel of claim 4, further comprising:
a gate insulating layer disposed between the oxide semiconductor layer and the gate electrode, wherein:
the data line extends in a first direction; and
a width of the gate insulating layer in the first direction is greater than a width of the gate electrode in the first direction.

8. The thin film transistor array panel of claim 4, further comprising:
a first passivation layer disposed on the gate electrode, wherein the first passivation layer comprises:
a first contact hole overlapping the data line;
a second contact hole overlapping the source electrode; and
a third contact hole overlapping the drain electrode.

9. The thin film transistor array panel of claim 8, wherein:
the second contact hole overlaps an edge of the source electrode; and
the third contact hole overlaps an edge of the drain electrode.

10. The thin film transistor array panel of claim 8, further comprising:
a connection electrode connecting the data line and the source electrode via the first contact hole and the second contact hole.

11. A method for manufacturing a thin film transistor array panel, the method comprising:
forming a data line on a substrate;
forming a buffer material layer on the substrate and the data line;
forming a first oxide semiconductor pattern on the buffer material layer;
forming a gate insulating pattern and a gate electrode on the first oxide semiconductor pattern; and
forming a buffer layer by etching a portion of the buffer material layer that is, in a plan view, spaced apart from the gate insulating pattern and the gate electrode,
wherein the first oxide semiconductor pattern overlaps a portion of the buffer layer in a direction of the plan view.

12. The method of claim 11, further comprising:
forming a second oxide semiconductor pattern by etching the first oxide semiconductor pattern using the gate insulating pattern as an etching mask,
wherein forming the buffer layer further comprises:
etching the buffer material layer using the first oxide semiconductor pattern as an etching mask.

13. The method of claim 12, wherein:
forming the gate electrode comprises:
forming a gate conductive layer on the substrate;
forming a first mask on the gate conductive layer; and
wet etching the gate conductive layer using the first mask as an etching mask; and
the method further comprises:

removing the first mask; and
forming a gate insulating layer by etching the gate insulating pattern using the gate electrode as an etching mask.

14. The method of claim 12, wherein:
forming of the gate electrode comprises:
forming a gate conductive layer on the substrate;
forming a first mask on the gate conductive layer; and
wet etching the gate conductive layer using the first mask as an etching mask; and
the method further comprises:
ashing a portion of the first mask; and
forming a gate insulating layer by etching the gate insulating pattern using the ashed first mask as an etching mask.

15. The method of claim 14, wherein:
widths of the gate electrode and the ashed first mask are substantially the same; and
edges of the gate insulating layer and the gate electrode are aligned.

16. The method of claim 14, wherein:
a width of the gate electrode is smaller than a width of the ashed first mask; and
a width of the gate insulating layer is greater than a width of the gate electrode.

17. The method of claim 12, further comprising:
forming a source electrode and a drain electrode by reducing portions of the second oxide semiconductor pattern disposed outside a portion of the second oxide semiconductor layer overlapping the gate electrode.

18. The method of claim 17, further comprising:
forming a first passivation layer on the gate electrode, wherein the first passivation layer comprises:
a first contact hole overlapping the data line;
a second contact hole overlapping the source electrode; and
a third contact hole overlapping the drain electrode.

19. The method of claim 18, wherein:
the second contact hole overlaps an edge of the source electrode; and
the third contact hole overlaps an edge of the drain electrode.

20. The method of claim 11, further comprising:
forming a light blocking layer on a same layer as the data line,
wherein:
the buffer layer comprises first and second regions with different thicknesses; and
the second region overlaps an edge of the light blocking layer.

21. The method of claim 18, wherein the first, second, and third contact holes are simultaneously formed.

22. The method of claim 21, wherein a depth of the first contact hole is greater than depths of the second and third contact holes.

23. The method of claim 20, further comprising:
forming a conductive layer on the substrate; and
patterning the conductive layer to simultaneously form the light blocking layer and the data line.

24. A thin film transistor array panel comprising:
a substrate;
a data line disposed on a first area of the substrate;
a buffer layer disposed on a second area of the substrate, the second area being spaced apart from the first area;
a thin film transistor disposed on the buffer layer, the thin film transistor comprising an oxide semiconductor layer; and a pixel electrode connected to the thin film transistor,
wherein the buffer layer comprises:
- a first region overlapping the oxide semiconductor layer; and
- a second region extending from the first region, the second region being less thick than the first region.

25. A method of manufacturing a thin film transistor array panel comprising:
- forming a data line on a substrate;
- forming a buffer material layer on the substrate and the data line;
- forming a first oxide semiconductor pattern on the buffer material layer;
- forming a gate insulating pattern and a gate electrode on the first oxide semiconductor pattern;
- forming a second oxide semiconductor pattern from the first oxide semiconductor pattern, formation of the second oxide semiconductor pattern forming a buffer material layer pattern from the buffer material layer; and
- forming a buffer layer from the buffer material layer pattern, wherein the buffer layer comprises:
- a first portion overlapping the second oxide semiconductor pattern; and
- a second portion extending from the first portion, the second portion being less thick than the first portion.

26. A thin film transistor array panel comprising:
- a substrate;
- a data line disposed on the substrate;
- a buffer layer disposed on the substrate and spaced apart from the data line in a plan view;
- a thin film transistor disposed on the buffer layer, the thin film transistor comprising an oxide semiconductor layer;
- a pixel electrode connected to the thin film transistor; and
- a light blocking layer disposed on a same layer as the data line, the light blocking layer overlapping the thin film transistor, wherein the buffer layer overlaps the light blocking layer, and wherein:
- the buffer layer comprises a first region and a second region;
- thicknesses of the first and second regions are different; and
- the second region overlaps an edge of the light blocking layer.

* * * * *